US010197650B2

(12) United States Patent
Dewdney

(10) Patent No.: US 10,197,650 B2
(45) Date of Patent: Feb. 5, 2019

(54) METHOD AND MAGNETIC RESONANCE APPARATUS FOR DETERMINING BASIC SHIM SETTINGS OF THE MAGNETIC RESONANCE APPARATUS

(71) Applicant: Siemens Aktiengesellschaft, Munich (DE)

(72) Inventor: Andrew Dewdney, Neunkirchen am Brand (DE)

(73) Assignee: Siemens Aktiengesellschaft, Munich (DE)

( * ) Notice: Subject to any disclaimer, the term of this patent is extended or adjusted under 35 U.S.C. 154(b) by 455 days.

(21) Appl. No.: 14/951,882

(22) Filed: Nov. 25, 2015

(65) Prior Publication Data
US 2016/0154076 A1 Jun. 2, 2016

(30) Foreign Application Priority Data
Nov. 28, 2014 (DE) .......................... 10 2014 224 446

(51) Int. Cl.
*G01R 33/3873* (2006.01)
(52) U.S. Cl.
CPC ................. *G01R 33/3873* (2013.01)
(58) Field of Classification Search
CPC ........... G01R 33/20; G01V 3/32; G01N 24/00
USPC ........................ 324/200, 300, 301, 307, 309; 600/407–423
See application file for complete search history.

(56) References Cited

U.S. PATENT DOCUMENTS

| 5,039,981 | A | * | 8/1991 | Rodriguez | G08B 13/24 324/228 |
| 5,391,990 | A | | 2/1995 | Schmitt et al. | |
| 5,532,597 | A | | 7/1996 | McGinley et al. | |
| 7,408,461 | B2 | * | 8/2008 | Fluck | G01V 3/081 324/243 |
| 9,046,587 | B2 | | 6/2015 | Tanabe | |
| 2002/0043975 | A1 | | 4/2002 | Aoki | |
| 2005/0242817 | A1 | * | 11/2005 | Hoult | G01V 3/10 324/326 |
| 2008/0290871 | A1 | | 11/2008 | Tamura | |
| 2009/0096453 | A1 | | 4/2009 | Barnes et al. | |
| 2010/0277174 | A1 | | 11/2010 | Van Den Brink et al. | |
| 2011/0037467 | A1 | | 2/2011 | Tsuda | |
| 2014/0329689 | A1 | | 11/2014 | Tanabe | |

(Continued)

FOREIGN PATENT DOCUMENTS

JP         2014004169 A      1/2014

*Primary Examiner* — Giovanni Astacio-Oquendo
(74) *Attorney, Agent, or Firm* — Schiff Hardin LLP

(57) ABSTRACT

In a method, device and magnetic resonance apparatus for determining basic shim settings for shim elements of a magnetic resonance scanner of the apparatus, an optimization function is established in a processor, which includes multiple optimization parameters, including a first optimization parameter that designates a homogeneity value of a spatial distribution of the basic magnetic field in the scanner, and a second optimization parameter that designates a value of a force acting on the shim elements. The processor is configured to calculate the spatial distribution of the shim elements by minimizing the optimization function, dependent on the first and second parameters. Shim settings for the scanner are determined using the calculated spatial distribution of the shim elements.

9 Claims, 2 Drawing Sheets

(56) References Cited

U.S. PATENT DOCUMENTS

| | | | | |
|---|---|---|---|---|
| 2015/0362570 A1* | 12/2015 | Sakakura | ............... | A61B 5/055 |
| | | | | 324/319 |
| 2016/0025830 A1* | 1/2016 | Roland | ................ | A61B 5/4312 |
| | | | | 324/309 |
| 2016/0089029 A1* | 3/2016 | Biber | ..................... | A61B 5/004 |
| | | | | 600/422 |

* cited by examiner

METHOD AND MAGNETIC RESONANCE APPARATUS FOR DETERMINING BASIC SHIM SETTINGS OF THE MAGNETIC RESONANCE APPARATUS

BACKGROUND OF THE INVENTION

Field of the Invention

The invention concerns a method for determining basic shim settings of a magnetic resonance scanner, and a computer, a non-transitory, data storage medium encoded with programming instructions, and a magnetic resonance apparatus for implementing such a method.

Description of the Prior Art

In a magnetic resonance apparatus, also referred to as a magnetic resonance tomography system, the body of a person to be examined, in particular a patient, is usually exposed by a basic field magnet to a relatively high basic magnetic field, for example of 1.5 or 3 or 7 Tesla. In addition gradient pulses are applied by a gradient coil unit. Radio-frequency pulses (excitation pulses) are then radiated by suitable antenna devices via a radio-frequency antenna unit, which cause the nuclear spins of specific atoms in the subject to be resonantly excited so as to be flipped by a defined flip angle in relation to the magnetic field lines of the basic magnetic field. During the relaxation of the nuclear spins, radio-frequency signals, so-called magnetic resonance signals, are emitted, which are received by suitable radio-frequency antennas and are then further processed. The desired image data can be reconstructed from the raw data acquired in this manner.

For a specific measurement (raw data acquisition), a specific magnetic resonance sequence, known as a pulse sequence, is executed, which is a sequence of radio-frequency pulses, especially excitation pulses and refocusing pulses, as well as gradient pulses matched thereto, emitted on different gradient axes along different spatial directions. Matching these pulses in time, readout windows are set, which predefine the periods of time in which the induced magnetic resonance signals are detected.

During magnetic resonance imaging with a magnetic resonance scanner, the homogeneity of a basic magnetic field in an examination volume of the scanner is of great significance. Even small deviations in the homogeneity can result in large deviations in the frequency distribution of the nuclear spins, so that the magnetic resonance image data recorded is of lower quality.

In order to improve the homogeneity in the examination volume, a magnetic resonance scanner typically has a shim unit. This shim unit usually has multiple shim elements. If a magnetic resonance scanner is installed at its intended location, then fields present in the environment can impair the homogeneity of the basic magnetic field, especially around an isocenter of the magnetic resonance scanner. Therefore the shim unit is set during installation and commissioning of a magnetic resonance scanner, frequently in conjunction with measurements, so that an optimum homogeneity is established. Thus basic shim settings can be determined for the installation and commissioning of the magnetic resonance scanner. The basic shim settings then include settings of the shim unit. Typically the basic shim settings are defined in such cases during the installation and commissioning of the magnetic resonance scanner.

SUMMARY OF THE INVENTION

An object of the invention is to provide a definition of basic shim settings of a magnetic resonance scanner optimized to the magnetic resonance scanner as a whole.

The inventive method for determining basic shim settings of a magnetic resonance scanner, wherein the basic shim settings include a spatial distribution of a number of shim elements, includes the following steps.

An optimization function is established in a processor, the optimization function including a number of optimization parameters, wherein a first optimization parameter thereof is a homogeneity value of a B0 distribution in the magnetic resonance scanner that is set by the basic shim settings, and a second optimization parameter thereof is a value of a force acting on the number of shim elements.

In the processor, the spatial distribution of the number of shim elements is calculated such that the optimization function is minimized, taking into account the first optimization parameter and the second optimization parameter.

The basic shim settings of the magnetic resonance scanner are determined in the processor using the calculated spatial distribution of the number of shim elements, and are made available as an electronic output from the processor.

The fact that the basic shim settings include a spatial distribution of the number of shim elements especially means that the basic shim settings define the locations in the magnetic resonance scanner, especially in a spatial environment of a gradient coil unit of the magnetic resonance scanner, at which the number of shim elements are positioned. The basic shim settings can thus include location information for the number of shim elements. The location information can be in the form of spatial coordinates. The spatial coordinates are then typically specified in relation to a fixed reference point of the magnetic resonance scanner. It is however especially advantageous for the magnetic resonance scanner to have a number of possible spatially-distributed positioning points at which the number of shim elements can be selectively positioned. The number of possible positioning points can be embodied as a pocket for example, so that the number of shim elements can be disposed especially easily at the positioning points embodied in the form of a pocket. These positioning points embodied as the form of a pocket are also called shim pockets. In the magnetic resonance scanner a number of shim pockets can be arranged grouped along a longitudinal direction of the magnetic resonance scanner in a shim compartment, also called a shim tray. The location information can then specify in which of a number of possible shim pockets the number of shim elements will be positioned. The location information can also specify how many of the number of shim elements are positioned in a shim pocket of the number of shim pockets. Thus the basic shim settings can especially advantageously include a distribution of the number of shim elements to the number of shim pockets.

The number of shim elements are typically formed of a magnetizable material, for example iron. The number of shim elements can have a plate-shaped structure. It is also conceivable for the number of shim elements to be embodied differently from one another, for example to differ in size, mass, etc. One shim unit of the magnetic resonance scanner can include the number of shim elements. The number of shim elements is especially disposed within a housing of the magnetic resonance scanner. It is advantageous for the number of shim elements to be disposed on the basic field magnet and/or a gradient coil unit of the magnetic resonance scanner. In this way the number of shim pockets in which the number of shim elements can be positioned, can be disposed on the basic field magnet and/or the gradient coil unit.

The first optimization parameter can seek an especially high homogeneity of the B0 distribution in the magnetic resonance scanner, particularly in a central area and/or in the isocenter of the magnetic resonance scanner. The B0 distribution in such cases specifies a field distribution of the basic magnetic field of the magnetic resonance scanner. Thus the homogeneity value of the first optimization parameter can have a minimal value, if an especially high homogeneity of the B0 distribution is present in the magnetic resonance scanner. In such cases, in the first optimization parameter, the B0 distribution in the magnetic resonance scanner set by taking into account the spatial distribution of the number of shim elements. In this way, using the first optimization parameter in the minimization of the optimization function can lead to the number of shim elements being disposed advantageously in the magnetic resonance scanner, such that the basic magnetic field is made especially homogeneous.

The second optimization parameter seeks to have an especially low force acting on the number of shim elements. Magnetic fields present in the magnetic resonance scanner typically exert a magnetic force on the magnetizable shim elements. In particular the high basic magnetic field of the magnetic resonance scanner can exert a very high force on the number of shim elements. The second optimization parameter can advantageously lead to an especially balanced spatial distribution of the number of shim elements, so that overall an axial force acting on the number of shim elements is minimized in the calculation of the spatial distribution of the number of shim elements. As an alternative or in addition the second optimization parameter can seek an especially small number of shim elements. Embodiments of the second optimization parameter are described in such cases in the following.

The fact that the optimization function is minimized, taking into account the number of optimization parameters, for example through the first optimization parameter and/or second optimization parameter, means that the number of optimization parameters each contribute a value to the optimization function. The respective optimization parameters can be individually weighted in the optimization function in such cases. Thus the optimization function can have a minimal value if a sum, such as a weighted sum, of the values of the number of optimization parameters is minimal. In this way the number of optimization parameters can be taken into account especially advantageously at the same time in the minimization of the optimization function. In particular, a mutual interaction of the number of optimization parameters can be taken into account in the minimization of the optimization function. In this way a situation can be avoided in which, although one optimization parameter of the number of optimization parameters has a very small value, a further optimization parameter of the number of optimization parameters must have a large value.

The basic settings of the magnetic resonance scanner are determined such that the calculated spatial distribution of the number of shim elements is included in the basic settings. The basic settings are determined specifically for different types of magnetic resonance scanners. The basic settings are determined specifically for an individual magnetic resonance scanner that is to be installed in a specific environment. The basic settings can then be tailored especially advantageously to the ambient conditions present in the specific environment. The basic settings of the magnetic resonance scanner are determined once for an individual magnetic resonance scanner. The basic settings are advantageously determined before the installation of the magnetic resonance scanner in the specific environment. The magnetic resonance scanner can then be installed and/or constructed using the basic shim settings. In this way a magnetic resonance scanner can included a shim unit with a number of shim elements, wherein a spatial distribution of the number of shim elements in the magnetic resonance scanner is defined on the basis of the basic shim settings determined. The basic shim settings in such cases are especially embodied as passive shim settings. This can mean that the basic shim settings are not adapted variably to different examination objects positioned in the magnetic resonance scanner. However it can be possible, in a subsequent adjustment, for the arrangement of the number of shim elements to be changed retroactively after an installation of the magnetic resonance scanner.

The inventive determination of the basic shim settings can include a computation of an especially advantageous spatial distribution of the number of shim elements in the magnetic resonance scanner. The spatial distribution is determined in the optimization of the optimization function in such cases especially advantageously by taking into account a number of optimization parameters. In this case it has proved meaningful to take into account at least the first optimization parameter, which takes account of the B0 distribution in the magnetic resonance scanner, and the second optimization parameter, which takes account of the force acting on the number of shim elements, in the calculation of the spatial distribution of the number of shim elements. It is also conceivable and especially advantageous to take into account further optimization parameters in the calculation of the spatial distribution of the number of shim elements. Possible further optimization parameters are described in following sections. In such cases the optimization function can include any given combination of the described optimization parameters.

The inventive method offers the advantage that a spatial distribution of the number of shim elements optimized to the overall magnetic resonance scanner can be calculated while at the same time taking into account a number of optimization parameters. The spatial distribution of the number of shim elements determined can thus represent a system optimum. Individual optimization parameters are not considered in isolation from one another in the calculation of the spatial distribution of the shim elements, but are included combined in the optimization function.

For example, the spatial distribution of the number of shim elements can be calculated such that a homogeneous B0 distribution is present in the magnetic resonance scanner and at the same time a force that is as low as possible acts on the number of shim elements. Through the homogeneous B0 distribution an image quality of magnetic resonance image data recorded by means of the magnetic resonance scanner can be improved. At the same time the reduction of the force acting on the number of shim elements can improve safety of the magnetic resonance scanner and/or avoid damage to the magnetic resonance scanner as a result of mechanical forces that are too high. The reduction of the force acting on the number of shim elements can likewise insure that the number of shim elements remain stably anchored in their position and are not displaced spatially. Mechanical interaction of the number of shim elements with other structures in the magnetic resonance scanner can thus be prevented, through which damage to the other structures can be prevented. For example, damage to the gradient coils, especially to cable connections of the gradient coils, by a displacement of the number of shim elements can be prevented in this way. A magnetic resonance scanner, for which the basic shim settings have been determined by the inventive method, can thus record magnetic resonance raw data in order to produce image data with high image quality, while at the same time being especially stable and/or safe, particularly in relation to damage.

In an embodiment, the second optimization parameter is a value of an axial force acting on the number of shim elements, wherein the axial force acts in the direction of a basic magnetic field of the magnetic resonance scanner. The axial force in this case represents the magnetic force of the basic magnetic field acting on the number of shim elements. The axial force is aligned essentially parallel to or along the longitudinal axis of the magnetic resonance scanner. The longitudinal axis of the magnetic resonance scanner in this case is predetermined by the orientation of the tunnel-shaped opening of the magnetic resonance scanner, in which an examination object can be positioned. It is advantageous to take account of an axial force acting on the number of shim elements, since this force typically represents the highest magnetic force acting on the number of shim elements. At the same time the axial force can be taken into account especially easily during the minimization of the optimization function, since it merely acts in a single spatial direction. It is also conceivable that, especially in addition to the axial force, an optimization parameter takes account of a radial force, which acts in a radial spatial direction on the number of shim elements. This is especially sensible when this radial force is relevant.

In another embodiment, the second optimization parameter seeks a minimization of the value of the overall axial force in the calculation of the spatial distribution of the number of shim elements, which acts on all shim elements of the magnetic resonance scanner. The value of the overall axial force in this case can be established by an addition of the values of all individual axial forces that act on all individual shim elements. In this case axial forces directed against one another can cancel each other. This is especially the case for shim elements positioned at opposite ends of the tunnel-shaped opening. It is therefore especially advantageous to minimize the overall axial force, since this represents the force effectively acting on all shim elements. At the same time the overall axial force can be taken into account especially easily as a single value in the optimization function.

In another embodiment, a third optimization parameter of the number of optimization parameters seeks a minimization of the total mass of all shim elements of the magnetic resonance scanner in the calculation of the spatial distribution of the number of shim elements, wherein, in the calculation of the spatial distribution of the number of shim elements, the optimization function is minimized taking into account the third optimization parameter. The third optimization parameter is then taken into account in the calculation of the spatial distribution of the number of shim elements in addition to the first optimization parameter and second optimization parameter. The third optimization parameter can also be taken into account in the calculation of the spatial distribution of the number of shim elements in combination with the fourth, fifth or sixth optimization parameters mentioned below. The minimization of the overall mass of all shim elements of the magnetic resonance scanner is based on the consideration that an overall force acting on all shim elements of the magnetic resonance scanner is typically scaled with the overall mass of the shim elements, provided forces canceling each other out are ignored. Through the minimization of the overall mass of the shim elements an overall force acting on all shim elements can thus be minimized indirectly. At the same time the minimization of the overall mass of the shim elements can lead to saving material and shortening the installation time for the magnetic resonance scanner. Furthermore, the reduction of the overall mass of the shim elements can lead to a reduction of undesired drift effects of the shim elements. The effect of mechanical tolerances can also be reduced in this way.

In another embodiment, the basic shim settings include a value of at least one constant shim current which flows through gradient coils of the magnetic resonance scanner, wherein a fourth optimization parameter of the number of optimization parameters seeks a minimization of the value of the at least one shim current in the calculation of the spatial distribution of the number of shim elements and, in the calculation of the spatial distribution of the number of shim elements, the optimization function is minimized, taking into account the fourth optimization parameter and the basic shim settings of the magnetic resonance scanner are determined using the at least one shim current. The fourth optimization parameter is then especially taken into account in the calculation of the spatial distribution of the number of shim elements in addition to the first optimization parameter and second optimization parameter. The fourth optimization parameter can also be taken into account in the calculation of the spatial distribution of the number of shim elements in combination with the third, fifth or sixth optimization parameter. The value of the at least one constant shim current is then especially included, together with the spatial distribution of the number of shim elements, in the basic shim settings. The at least one shim current is then switched with the defined value in the gradient coils when magnetic resonance image data of an examination object is being recorded by operation of the magnetic resonance scanner. The constant shim current, which flows through the gradient coils, can then, when overlaid with shim coil shim currents which flow through shim coils, contribute to an increase in the homogeneity of the basic magnetic field. The constant shim current can also make a reduction of a number of shim elements and/or of an overall mass of the shim elements possible. The gradient currents, which flow through the gradient coils during the gradient switchings and/or gradient pulses of a magnetic resonance sequence, are then switched overlaid with the at least one constant shim current. This leads, during magnetic resonance sequences with a high magnetic stress on the gradient coils, to a load limit of the gradient coils being able to be reached, should a high constant shim current still additionally be flowing through the gradient coils. This takes account of the fourth optimization parameter, which is intended to insure that only a smallest possible constant shim current should flow through the gradient coils. Consequently the gradient coils have a higher capacity for the gradient currents of gradient switchings and/or gradient pulses of a magnetic resonance sequence. In this way, by the optimization that takes into account the fourth optimization parameter, magnetic resonance sequences with especially high performance requirements on the gradient coils can be carried out.

In another embodiment, a fifth optimization parameter of the number of optimization parameters seeks a minimization of an overall effect of temperature influences on the number of shim elements in the calculation of the spatial distribution of the number of shim elements and, in the calculation of the spatial distribution of the number of shim elements the optimization function is minimized, taking into account the fifth optimization parameter. The fifth optimization parameter is then taken into account in the calculation of the spatial distribution of the number of shim elements in addition to the first optimization parameter and second optimization parameter. The fifth optimization parameter can also be taken into account in the calculation of the spatial distribution of the number of shim elements in combination with the third, fourth or sixth optimization parameters. During ongoing operation of the magnetic resonance scanner there can be an increase in the temperature of the number of shim elements. This is especially the case if magnetic resonance sequences with high power requirements on the magnetic resonance scanners, such as functional imaging sequences, are carried out by the magnetic resonance scanner. The heating of the number of shim elements can lead to a change in the magnetic properties of the number of shim elements. The temperature influence on the number of shim elements can thus cause a change in the magnetization of the number of shim elements. A possible consequence thereof can be a change in the strength of the basic magnetic field, which can lead to a change in a resonant frequency of nuclear spins, a so-called frequency drift. Therefore it is sensible to take account in the fifth optimization parameter of an overall effect on the number of shim elements in the calculation of the spatial distribution of the number of shim elements. Taking account of the fifth optimization parameter can thus lead to a stable, temperature-independent, strength of the basic magnetic field of the magnetic resonance scanner.

In another embodiment, the magnetic resonance scanner has, a number of shim pockets, in which the number of shim elements are disposed, a sixth optimization parameter of the number of optimization parameters includes a minimization of a value of a maximum force acting on the shim elements of a shim pocket of the number of shim pockets during the calculation of the spatial distribution of the number of shim elements, and, during the calculation of the spatial distribution of the number of shim elements, the optimization function is minimized, while taking account of the sixth optimization parameter. The sixth optimization parameter is then taken into account during the calculation of the spatial distribution of the number of shim elements in addition to the first optimization parameter and second optimization parameter. The sixth optimization parameter can also be taken into account during the calculation of the spatial distribution of the number of shim elements in combination with the third, fourth or fifth optimization parameters. In this case the sixth optimization parameter can include a calculation of the values of the number of shim pocket forces which are acting on each individual shim pocket of the number of shim pockets. A value of a shim pocket force of a specific shim pocket is thus especially calculated by an addition of the values of all forces acting on the shim elements of the specific shim pocket. The value of the maximum force is then especially the value of those shim pocket forces that have the greatest value. This maximum force should then be kept as low as possible in accordance with the sixth optimization parameter. An optimization of the spatial distribution of the number of shim elements in accordance with the sixth optimization parameter can thus lead to a far-reaching, uniform distribution of the number of shim elements to the number of shim pockets. Especially advantageously, taking account of the sixth optimization parameter in the calculation of the spatial distribution of the number of shim elements can prevent too large a mass of shim elements being positioned in an individual shim pocket. Thus a disproportionately high force can be prevented from acting on individual shim pockets. In this way a mechanical load and/or displacement of individual shim pockets can be prevented and thus stability and/or safety of the magnetic resonance scanner can be further improved.

The inventive shim setting determination computer for determining basic shim settings of a magnetic resonance scanner includes an optimization processor, a calculation processor and a determination processor, wherein the shim setting determination processor is configured to carry out a method as claimed in one of the preceding claims. These processors may be the same processor, or separate from each other.

The shim setting determination processor is configured to carry out a method for determining basic shim settings of a magnetic resonance scanner, wherein the basic shim settings include a spatial distribution of a number of shim elements. The optimization processor is configured to set up an optimization function that includes a number of optimization parameters, wherein a first optimization parameter of the number of optimization parameters includes a homogeneity value of a B0 distribution in the magnetic resonance scanner that is set by the basic shim settings and a second optimization parameter of the number of optimization parameters includes a value of a force acting on the number of shim elements. The calculation processor and the optimization processor are designed to calculate the spatial distribution of the number of shim elements such that the optimization function is minimized, while taking account of the first optimization parameter and the second optimization parameter. The determination processor is designed for determining the basic shim settings of the magnetic resonance scanner using the calculated spatial distribution of the number of shim elements.

The invention also encompasses a non-transitory, computer-readable data storage medium encoded with programming instructions that can be loaded directly into a memory of a programmable calculation processor of a shim setting determination computer. The program code cause execution of the inventive method by the calculation processor. This enables the inventive method to be carried out rapidly, in an identically-repeatable manner and robustly. The calculation processor must have an appropriate main memory, an appropriate graphics card or an appropriate logic unit for example, so that the respective method steps can be executed efficiently.

The inventive magnetic resonance scanner has a shim unit with a number of shim elements, wherein a spatial distribution of the number of shim elements in the magnetic resonance scanner is defined on the basis of basic shim settings, which have been determined by the inventive method. The magnetic resonance scanner, for which the basic shim settings have been defined by the inventive method, can thus acquire magnetic resonance raw data from which image data area obtained that produce an image with high image quality, and is at the same time especially stable and/or safe, particularly with regard to damage.

The inventive magnetic resonance apparatus has a magnetic resonance scanner and a shim settings determination computer as described above. The shim setting determination processor thus defines the spatial distribution of the number of shim elements in the magnetic resonance scanner.

The advantages of the inventive shim settings determination processor, the inventive storage medium and the inventive magnetic resonance scanner essentially correspond to the advantages of the inventive method, which have been described above. The functional features of the method are embodied by corresponding physical modules, especially by hardware modules.

DESCRIPTION OF THE PREFERRED EMBODIMENTS

Figure 1:
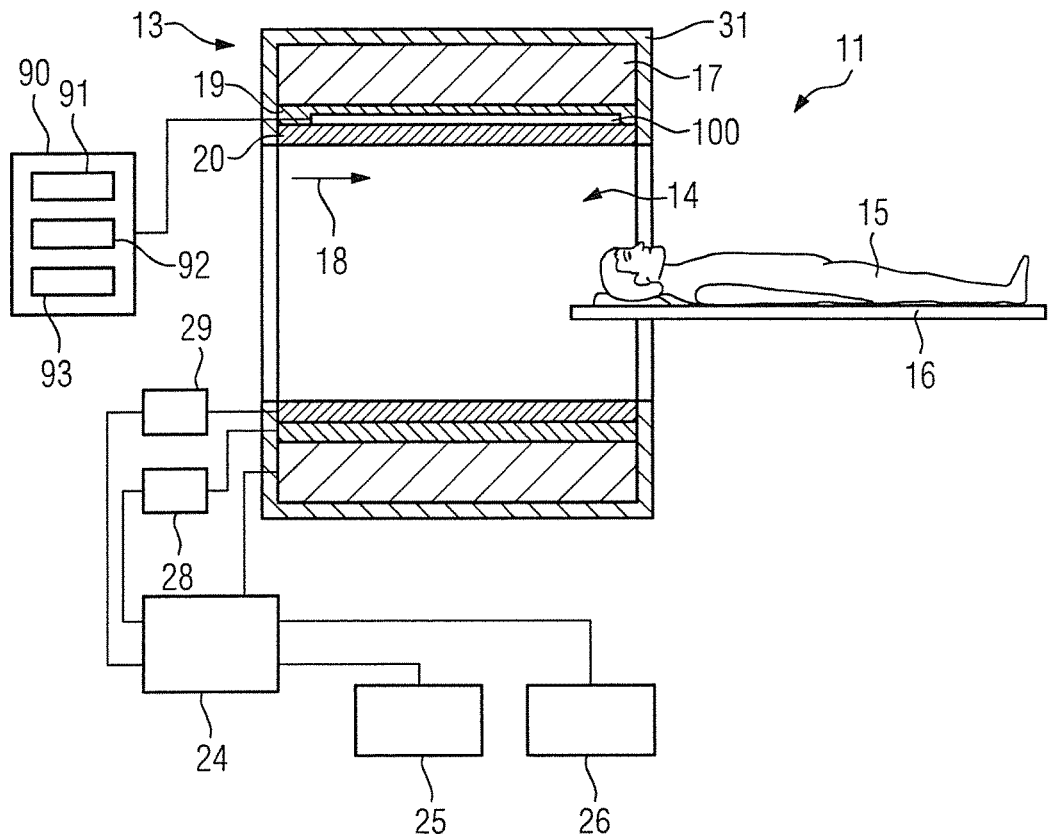
FIG. 1 shows an inventive system, that includes an inventive magnetic resonance scanner and an inventive shim settings determination computer, in a schematic diagram.

FIG. 1 is a block diagram of an inventive apparatus. The inventive apparatus has an inventive magnetic resonance scanner 11. The inventive system further has an inventive shim setting determination computer 90.

The inventive magnetic resonance scanner 11 has a magnet unit 13 with a basic field magnet 17 for creating a strong and constant basic magnetic field 18. The magnetic resonance scanner 11 also has a cylindrical patient receiving area 14 for receiving an examination object 15, in the present case a patient 15, wherein the patient receiving area 14 is surrounded in a circumferential direction by the magnet unit 13 in a cylindrical shape. The patient 15 can be moved by a patient support 16 of the magnetic resonance scanner 11 into the patient receiving area 14. To this end the patient support 16 has a support table, which is disposed movably within the magnetic resonance scanner 11. The magnet unit 13 is shielded from the outside by a housing shield 31.

The magnet unit 13 further has a gradient coil unit 19 to create magnetic field gradients, which are used for spatial encoding of the magnetic resonance signals during imaging. The gradient coil unit 19 is activated by a gradient control processor 28. Furthermore the magnet unit 13 has a radio-frequency (RF) antenna unit 20, which, in the case shown, is embodied as a body coil permanently integrated into the magnetic resonance scanner 10, and a radio-frequency antenna control processor 29 for operating the RF antenna unit 20 to excite nuclear spins in the examination object 15 so as to deviate from the polarization that is produced in the basic magnetic field 18 created by the basic field magnet 17. The radio-frequency antenna unit 20 is activated by the radio-frequency antenna control processor 29 and radiates radio-frequency magnetic resonance sequences into an examination area, which is essentially formed by the patient receiving area 14. The radio-frequency antenna unit 20 is further embodied for receiving magnetic resonance signals, especially from the patient 15.

For control of the basic field magnet 17, the gradient control processor 28 and the radio-frequency antenna control processor 29, the magnetic resonance scanner 11 has a calculation processor 24. The calculation processor 24 centrally controls the magnetic resonance scanner 11, such as to execute a predetermined imaging gradient echo sequence. Control information, such as imaging parameters, as well as reconstructed magnetic resonance images can be made available at an output interface for the user, in the present case a display monitor 25 of the magnetic resonance scanner 11. In addition the magnetic resonance scanner 11 has an input interface 26, via which information and/or parameters can be entered during a measurement process by a user. The calculation processor 24 can include the gradient control processor 28 and/or the radio-frequency antenna control processor 29 and/or the display monitor 25 and/or the input interface 26.

The magnetic resonance scanner 11 further has a shim unit 100. The shim unit 100 has a number of shim elements. An exemplary embodiment of the shim unit 100 is show in FIG. 2 and FIG. 3.

The magnetic resonance scanner 11 can have further components that such scanners usually have. The basic operation of such a magnetic resonance scanner 11 is known to those skilled in the art, so that a more detailed description of the further components is not necessary herein.

The shim setting determination computer 90 for determining basic shim settings of the magnetic resonance scanner 11 has an optimization processor 91, a calculation processor 92 and a determination processor 93. In this way the shim setting determination computer 90 is designed to carry out the inventive method.

In the shown embodiment, the shim setting determination computer 90 is installed separately from the magnetic resonance scanner 11. In the case shown the shim setting determination computer 90 is connected to the magnetic resonance scanner 11, especially with regard to the exchange of data. In the case shown the shim setting determination computer 90 is connected to the shim unit 100 of the magnetic resonance scanner 11. The shim setting determination computer 90 can also be connected to the calculation processor 24 of the magnetic resonance scanner 11. It is also conceivable for the shim setting determination computer 90 to be connected to a number of magnetic resonance scanners 11. The shim setting determination computer 90 can be integrated into the magnetic resonance scanner 11 other than in the way shown in FIG. 1, especially into a calculation processor 24 of the magnetic resonance scanner 11.

Basic shim settings, which are transferred to the magnetic resonance scanner 11, are determined by the shim setting determination computer 90. The shim unit 100 of the magnetic resonance scanner 11 can be set and/or configured on the basis of the basic shim settings. In particular, a spatial distribution of the number of shim elements of the shim unit 100 in the magnetic resonance scanner 11 is defined on the basis of the basic shim settings.

Figure 2:
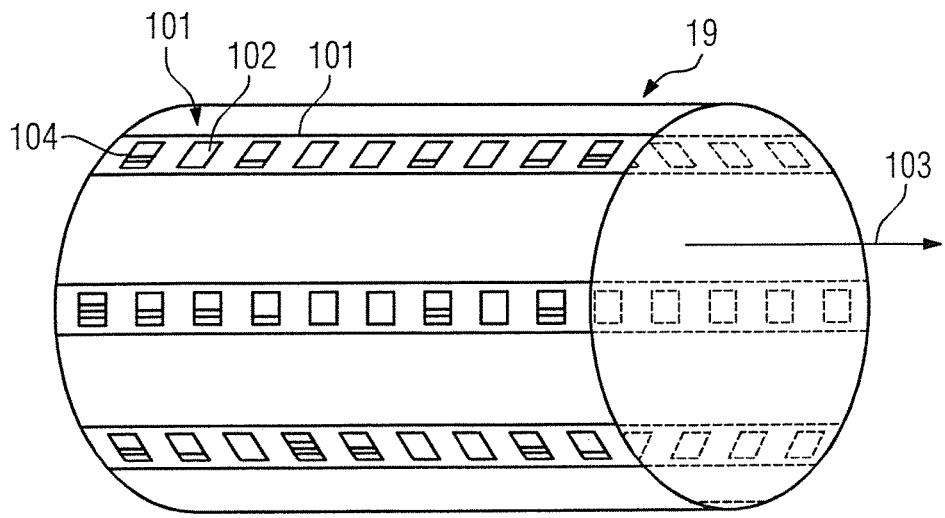
FIG. 2 shows an embodiment of a shim unit of an inventive magnetic resonance scanner in a schematic diagram.

FIG. 2 shows an embodiment of a shim unit 100 of the inventive magnetic resonance scanner 11 in a schematic diagram.

FIG. 2 shows an exemplary spatial distribution of the number of shim elements 104 in the shim unit 100. The spatial distribution of the number of shim elements 104 is determined by the inventive method in accordance with FIG. 4. The spatial distribution of the number of shim elements 104 shown in FIG. 2 is only an example and is just one possible result of the optimization algorithm, which is shown here for illustration. It is also conceivable for the shim unit 100 of the magnetic resonance scanner 11 to be embodied differently from the shown embodiment.

The shim unit 100 of the magnetic resonance scanner 11 shown in FIG. 2 is disposed on the gradient coil unit 19. The shim unit 100 is disposed in the form of a cylindrical jacket around the patient receiving area 14 of the magnetic resonance scanner 11. The axis of symmetry of the cylindrical jacket forms the longitudinal axis 103 of the shim unit 100. The longitudinal axis 103 is at the same time disposed in parallel to the basic magnetic field 18 of the magnetic resonance scanner 11. The axial force then acts, in the direction of the longitudinal axis 103, on the number of shim elements 104.

The shim unit 100 has a number of shim trays 101. The shim trays 101 extend parallel to the longitudinal axis 103. Three shim trays 101 of the shim unit 100 are shown in FIG. 2. A typical shim unit 100, however, will have more shim trays 101, possibly more than ten shim trays 101. In the case shown the shim trays 101 are embodied as slots on the cylindrical jacket of the gradient coil 19. Each shim tray 101 has a number of shim pockets 102, in which the shim elements 104 are disposed. The shim pockets 102 are designed in this case to receive a variable number of shim elements 104.

Figure 3:
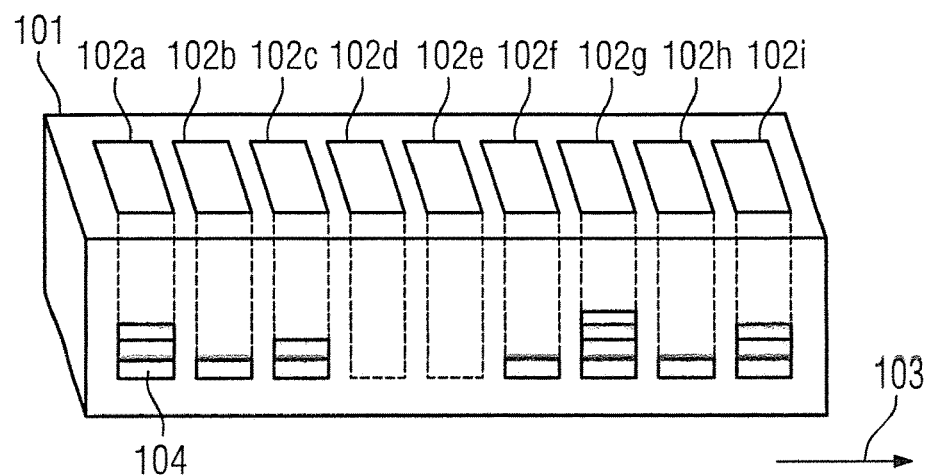
FIG. 3 shows an embodiment of a shim tray of a shim unit of an inventive magnetic resonance scanner in a schematic diagram.

An exemplary embodiment of such a shim tray 101 of a shim unit 100 is shown schematically in FIG. 3. The example of the shim tray 101 shown in FIG. 3 has nine shim pockets 102a, 102b, 102c, 102d, 102e, 102f, 102g, 102h, 102i, which are disposed parallel to the longitudinal direction 103 of the shim tray 101. In the case shown a first shim pocket 102a has three shim elements 104, a second shim pocket 102b has one shim element 104, a third shim pocket 102c has two shim elements, a fourth shim pocket 102d has no shim elements, etc. The shim elements 104 can be stacked in the shim pockets 102a, 102b, 102c, 102d, 102e, 102f, 102g, 102h, 102i, introduced through an opening. The distribution of the number of shim elements 104 among the shim pockets 102a, 102b, 102c, 102d, 102e, 102f, 102g, 102h, 102i shown as an example has been calculated by the inventive method while minimizing the optimization function. In the basic shim settings thus defined, which include the spatial distribution of the number of shim elements 104, information can be designated as to how many shim elements 104 are to be disposed in which shim pockets 102a, 102b, 102c, 102d, 102e, 102f, 102g, 102h, 102i during the installation of the magnetic resonance scanner. Thus, for example, the basic shim settings in FIG. 3 can specify that one shim element 104 is to be disposed in the sixth shim pocket 102f of the shim tray 101 shown.

Overall, the spatial distribution of the number of shim elements 104 included in the basic shim settings can lead to the arrangement of the number of shim elements 104 shown in FIG. 2. The multiple shim elements 104 are then advantageously arranged so that an especially small force acts on the number of shim elements 104, and at the same time the number of shim elements 104 leads to an especially high homogeneity of the basic magnetic field 18 of the magnetic resonance scanner 11. At the same time the arrangement of the number of shim elements 104 can take account of further optimization conditions.

Figure 4:
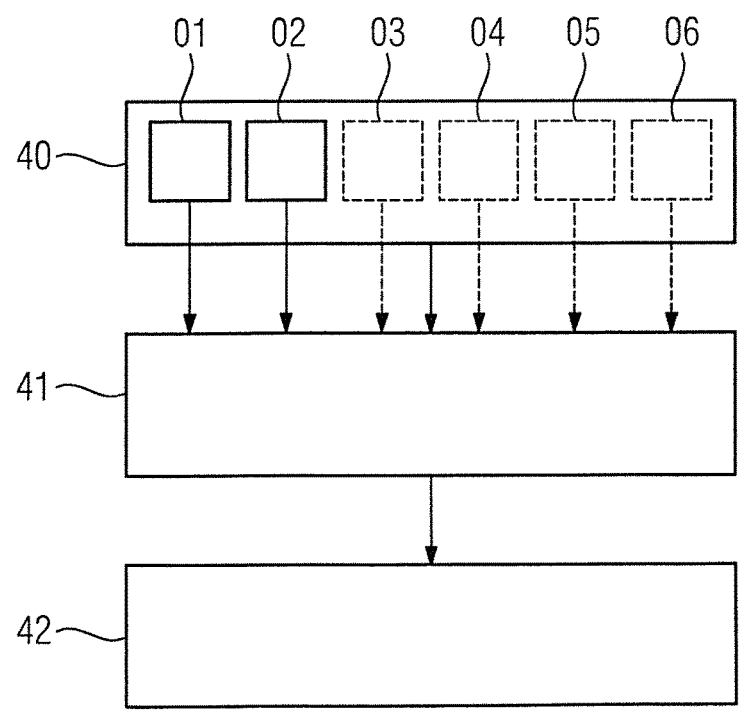
FIG. 4 is a flowchart of an embodiment of the inventive method.

FIG. 4 is a flowchart of a first embodiment of the inventive method for determining basic shim settings of a magnetic resonance scanner. The basic shim settings in this case comprise a spatial distribution of a number of shim elements.

In a first method step 40, the optimization processor 91 sets up an optimization function. The optimization function incorporates multiple optimization parameters O1, O2, O3, O4, O5, O6.

A first optimization parameter O1 of the multiple optimization parameters O1, O2, O3, O4, O5, O6 is a homogeneity value of a B0 distribution in the magnetic resonance scanner set by means of the basic shim settings. The optimization function can thus be a first term that may be weighted, which forms the first optimization parameter O1. The first term can then be minimal, when a homogeneous B0 distribution is present in the magnetic resonance scanner 11, particularly in a central area and/or isocenter of the magnetic resonance scanner 11. The homogeneity value in this case can be quantified as ppm (parts per million). Furthermore a minimum homogeneity value can be predetermined, which can be taken into account in the first optimization parameter O1. The minimum homogeneity value may not be exceeded during an optimization of the optimization function.

A second optimization parameter O2 of the number of optimization parameters O1, O2, O3, O4, O5, O6 is a value of a force acting on the number of shim elements. The optimization function can thus be a second that may be weighted, which forms the first optimization parameter O2. The second term then has a minimal value when a minimal force acts on the number of shim elements. It is advantageous that the second optimization parameter O2 comprises a minimization of a value of an overall force acting on all shim elements of the magnetic resonance scanner during the calculation of the spatial distribution of the number of shim elements. The second optimization parameter O2 can be a value of an axial force acting on the number of shim elements. The axial force acts in the direction of the basic magnetic field of the magnetic resonance scanner 11. In this way an overall axial force which acts on a shim element can be minimized.

While the first optimization parameter O1 and the second optimization parameter O2 are integrated by default into the optimization function, the optimization function can optionally also embody further optimization parameters. In such cases the optimization function can embody any number of further optimization parameters in addition to the first optimization parameter O1 and second optimization parameter O2. FIG. 4 shows the case in which the optimization function embodies a third optimization parameter O3, a fourth optimization parameter O4, a fifth optimization parameter O5 and a sixth optimization parameter O6. It is also conceivable for the optimization function, with the first optimization parameter O1 and second optimization parameter O2, only to embody a selection from among the third optimization parameter O3, fourth optimization parameter O4, fifth optimization parameter O5 and sixth optimization parameter O6. In such cases the optimization function can include any combination of the third optimization parameter O3, fourth optimization parameter O4, fifth optimization parameter O5 and sixth optimization parameter O6 in addition to the first optimization parameter O1 and second optimization parameter O2. The optimization function can also not include any further optimization parameters other than the first optimization parameter O1 and second optimization parameter O2. In addition to the homogeneity value and the force acting on the shims, further system-relevant properties of the magnetic resonance scanner can also be taken into account in the calculation of the spatial distribution of the number of shim elements.

The third optimization parameter O3 of the number of optimization parameters O1, O2, O3, O4, O5, O6 seeks, when it is used, a minimization of an overall mass of all shim elements of the magnetic resonance scanner during the calculation of the spatial distribution of the number of shim elements. Thus the overall mass of all shim elements can be included as a term in the optimization function.

If the fourth optimization parameter O4 of the number of optimization parameters O1, O2, O3, O4, O5, O6 is used, the basic shim settings have a value of at least one constant shim current that flows through gradient coils of the magnetic resonance scanner. The fourth optimization parameter O4 then seeks a minimization of the value of the at least one shim current during the calculation of the spatial distribution of the number of shim elements. The constant shim current in such cases can be considered as the initial value (offset) of the currents flowing through the gradient coils during an examination with the magnetic resonance scanner 11. The gradient currents provided by the magnetic resonance sequence are consequently fed overlaid on the at least one constant shim current into the gradient coils.

The fifth optimization parameter O5 of the number of optimization parameters O1, O2, O3, O4, O5, O6 seeks, when provided it is used, a minimization of an overall effect of temperature influences on the number of shim elements during the calculation of the spatial distribution of the number of shim elements. In such cases a change in a magnetization of the number of shim elements during the optimization caused by the temperature influences can be taken into account. In this way an influence of temperature fluctuations on a strength of the basic magnetic field 18 can be reduced.

When the sixth optimization parameter O6 of the number of optimization parameters O1, O2, O3, O4, O5, O6 is used, then the magnetic resonance scanner has a number of shim pockets, in which the number of shim elements are arranged (see FIG. 2 and FIG. 3). The sixth optimization parameter O6 then seeks a minimization of a value of a maximum force acting on the shim elements of one shim pocket of the number shim pockets during the calculation of the spatial distribution of the number of shim elements. In this way a shim pocket on which an especially high force is acting can be determined. The loading of this shim pocket can then be reduced. Naturally the magnetic resonance scanner, especially the shim unit of the magnetic resonance scanner, can also have the number of shim pockets regardless of the use of the sixth optimization parameter O6.

In a further method step 41 the calculation processor 92 of the shim setting determination computer 90 calculates the spatial distribution of the number of shim elements such that the optimization function is minimized, taking into account the first optimization parameter O1 and the second optimization parameter O2. If the optimization function includes the third optimization parameter O3, then the optimization function is minimized, taking into account the third optimization parameter O3 during the calculation of the spatial distribution of the number of shim elements. If the optimization function includes the fourth optimization parameter O4, then the optimization function is minimized, taking into account the fourth optimization parameter O4 during the calculation of the spatial distribution of the number of shim elements. If the optimization function includes the fifth optimization parameter O5, then the optimization function is minimized, taking into account the fifth optimization parameter O5 during the calculation of the spatial distribution of the number of shim elements. If the optimization function includes the sixth optimization parameter O6, then the optimization function is minimized, taking into account the sixth optimization parameter O6, during the calculation of the spatial distribution of the number of shim elements.

The spatial distribution of the number of shim elements is accordingly calculated, taking into account at least two optimization parameters, advantageously taking into account more than two optimization parameters. In this way an advantageous spatial distribution of the number of shim elements can be calculated, which simultaneously takes account of a number of boundary conditions. It is accordingly possible to calculate a spatial distribution of the number of shim elements optimized to the overall system.

In a further method step 42 the determination processor 93 of the shim setting determination computer 90 determines the basic shim settings of the magnetic resonance scanner using the calculated spatial distribution of the number of shim elements. On the basis of the basic shim settings thus determined, in a further method step not shown, the shim unit of the magnetic resonance scanner 11 can then be configured. An example of a shim unit configured in this way is shown in FIG. 2 and FIG. 3. If the fourth optimization parameter O4 of the number of optimization parameters O1, O2, O3, O4, O5, O6 is used, the basic shim settings of the magnetic resonance scanner 11 are determined using the at least one shim current.

The method steps of the inventive method shown in FIG. 4 are executed by a computation module of the shim setting determination computer 32. The computation module includes the required software and/or computer programs for this purpose, which are stored in a memory unit of the computation module. The software and/or computer programs comprise program means which are designed to carry out the inventive method, when the computer program and/or the software are executed in the computation module by means of a processor unit of the computation module.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining basic shim settings that shim a basic magnetic field of a magnetic resonance scanner, wherein the basic shim settings comprise a spatial distribution of a number of shim elements, comprising:

in a processor, establishing an optimization function that comprises a plurality of optimization parameters, including a first optimization parameter that designates a homogeneity value of a B0 distribution in the magnetic resonance scanner to be set by the basic shim settings and a second optimization parameter that designates a value of a force acting on the number of shim elements;

in said processor, calculating the spatial distribution of the number of shim elements by minimizing the optimization function dependent on the first optimization parameter and the second optimization parameter;

in said processor, determining the basic shim settings of the magnetic resonance scanner using the calculated spatial distribution of the number of shim elements, and making the basic shim settings available from the processor as an electronic signal; and placing said number of shim elements at respective locations in said magnetic resonance scanner in the calculated spatial distribution that corresponds to the determined basic shim settings.

2. The method as claimed in claim 1, wherein the second optimization parameter designates a value of an axial force acting on the number of shim elements, wherein the axial force acts in the direction of the basic magnetic field of the magnetic resonance scanner.

3. The method as claimed in claim 1, wherein the second optimization parameter designates a minimization of a value of an overall axial force that acts on all shim elements of the magnetic resonance scanner, during the calculation of the spatial distribution of the number of shim elements.

4. The method as claimed in claim 1 comprising at least two of:

minimizing said optimization function dependent on a third optimization parameter that designates a minimization of an overall mass of all shim elements of said magnetic resonance scanner;

minimizing said optimization function dependent on a fourth optimization parameter that designates a value of at least one constant shim current that flows through gradient coils of the magnetic resonance scanner, and determining said basic shim settings using said at least one shim current;

minimizing said optimization function dependent on a fifth optimization parameter that designates a minimization of an overall effect of temperature influences on said plurality of shim elements; and minimizing said optimization function dependent on a sixth optimization parameter that designates a value of a maximum force acting on the plurality of shim elements, wherein said shim elements are respectively disposed in shim pockets in said magnetic resonance scanner.

5. The method as claimed in claim 1, comprising:
minimizing said optimization function dependent on a third optimization parameter that designates a minimization of an overall mass of all shim elements of said magnetic resonance scanner.

6. The method as claimed in claim 1, comprising:
minimizing said optimization function dependent on a fourth optimization parameter that designates a value of at least one constant shim current that flows through gradient coils of the magnetic resonance scanner, and determining said basic shim settings using said at least one shim current.

7. The method as claimed in claim 1, comprising:
minimizing said optimization function dependent on a fifth optimization parameter that designates a minimization of an overall effect of temperature influences on said plurality of shim elements.

8. The method as claimed in claim 1, comprising:
minimizing said optimization function dependent on a sixth optimization parameter that designates a value of a maximum force acting on the plurality of shim elements, wherein said shim elements are respectively disposed in shim pockets in said magnetic resonance scanner.

9. A magnetic resonance apparatus comprising:
a magnetic resonance scanner comprising a plurality of shim elements that are distributable in a spatial distribution in said magnetic resonance scanner in order to shim a basic magnetic field generated in said magnetic resonance scanner;

a processor configured to establish an optimization function that comprises a plurality of optimization parameters, including a first optimization parameter that designates a homogeneity value of a B0 distribution in the magnetic resonance scanner to be set by basic shim settings and a second optimization parameter that designates a value of a force acting on the number of shim elements;

said processor being configured to calculate the spatial distribution of the number of shim elements by minimizing the optimization function dependent on the first optimization parameter and the second optimization parameter;

said processor being configured to determine shim settings for the shim elements of the magnetic resonance scanner using the calculated spatial distribution of the number of shim elements, and to make the basic shim settings available from the processor as an electronic signal; and said plurality of shim elements being placed at respective locations in said magnetic resonance scanner in the calculated spatial distribution that corresponds to the determined basic shim settings.

* * * * *